(12) United States Patent
Kwon et al.

(10) Patent No.: US 9,761,771 B2
(45) Date of Patent: Sep. 12, 2017

(54) LIGHT-EMITTING FILM (71) Applicant: LG CHEM, LTD., Seoul (KR)

(72) Inventors: Tae Gyun Kwon, Daejeon (KR); Su Young Ryu, Daejeon (KR); Moon Soo Park, Daejeon (KR); Seong Min Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/314,891

(22) PCT Filed: Aug. 13, 2015

(86) PCT No.: PCT/KR2015/008492
§ 371 (c)(1),
(2) Date: Nov. 29, 2016

(87) PCT Pub. No.: WO2016/024827
PCT Pub. Date: Feb. 18, 2016

(65) Prior Publication Data
US 2017/0200871 A1 Jul. 13, 2017

(30) Foreign Application Priority Data

Aug. 14, 2014 (KR) .......................... 10-2014-0106237
Aug. 13, 2015 (KR) .......................... 10-2015-0114368

(51) Int. Cl.
*H01L 33/50* (2010.01)
*H01L 33/56* (2010.01)
(Continued)

(52) U.S. Cl.
CPC ................ *H01L 33/56* (2013.01); *C08K 3/36* (2013.01); *C08K 11/00* (2013.01); *C09K 11/025* (2013.01);
(Continued)

(58) Field of Classification Search
CPC ......... H01L 33/50; H01L 33/502; C08K 3/36; C09K 11/025
See application file for complete search history.

(56) References Cited

U.S. PATENT DOCUMENTS

2006/0083694 A1* 4/2006 Kodas .................. B01J 13/0043
424/46
2011/0204339 A1* 8/2011 Dobbs .................... C09K 11/06
257/40
(Continued)

FOREIGN PATENT DOCUMENTS

JP 2009128488 A 6/2009
JP 2010271682 A 12/2010
(Continued)

Primary Examiner — Phuc Dang
(74) Attorney, Agent, or Firm — Dentons US LLP (57) ABSTRACT The present application relates to a light-emitting film, a method of manufacturing the same, a lighting device and a display device. The present application may provide a light-emitting film capable of providing a lighting device having excellent color purity and efficiency and an excellent color characteristic. The characteristics of the light-emitting film of the present application may be stably and excellently maintained for a long time. The light-emitting film of the present application may be used for various uses including photovoltaic applications, an optical filter or an optical converter, as well as various lighting devices.

18 Claims, 3 Drawing Sheets (51) Int. Cl.
*C09K 11/02* (2006.01)
*C08K 11/00* (2006.01)
*C08K 3/36* (2006.01)

(52) U.S. Cl.
CPC ...... *H01L 33/502* (2013.01); *C08K 2201/001* (2013.01); *C08K 2201/011* (2013.01); *H01L 2933/005* (2013.01); *H01L 2933/0033* (2013.01); *H01L 2933/0041* (2013.01)

(56) References Cited

U.S. PATENT DOCUMENTS

| | | | |
|---|---|---|---|
| 2013/0075692 A1 | 3/2013 | Naasani et al. | |
| 2013/0255778 A1* | 10/2013 | Okaniwa | C08K 7/16 136/259 |
| 2014/0030507 A1 | 1/2014 | Yoshida et al. | |
| 2015/0083970 A1 | 3/2015 | Koh et al. | |
| 2016/0161066 A1* | 6/2016 | Sung | H01L 33/502 362/84 |

FOREIGN PATENT DOCUMENTS

| | | |
|---|---|---|
| KR | 1020110038191 A | 4/2011 |
| KR | 1020110048397 A | 5/2011 |
| KR | 1020140064979 A | 5/2014 |
| KR | 1020140081152 A | 7/2014 |
| WO | 2012132239 A1 | 10/2012 |

\* cited by examiner

LIGHT-EMITTING FILM

TECHNICAL FIELD

This application is a National Stage Application of International Application No. PCT/KR2015/008492, filed Aug. 13, 2015, and claims the benefit of Korean Patent Application No. 10-2015-0114368, filed Aug. 13, 2015 and Korean Patent Application No. 10-2014-0106237, filed Aug. 14, 2014, the contents of which are incorporated herein by reference in their entirety for all purposes as if fully set forth below.

The present application relates to a light-emitting film, a method of manufacturing the same, a lighting device and a display device.

BACKGROUND ART

Lighting devices are used for various purposes. For example, lighting devices may be used for backlight units (BLUs) of displays such as a liquid crystal display (LCD), a TV, a computer, a mobile phone, a smart phone, a personal digital assistant (PDA), a gaming device, an electronic reading device, and a digital camera. Also, the lighting devices may be used for interior or exterior lighting, stage lighting, decorative lighting, accent lighting, museum lighting, or specific wavelength lighting necessary for horticulture or biology.

As a lighting device, for example, there is a device emitting white light by a combination of phosphors such as a blue light-emitting diode (LED) and a yttrium aluminum garnet (YAG) used as an LCD BLU.

PRIOR ART DOCUMENTS

Patent Documents (Patent Document 1) Korean Unexamined Patent Application Publication No. 2011-0048397

(Patent Document 2) Korean Unexamined Patent Application Publication No. 2011-0038191

DISCLOSURE

Technical Problem

The present application provides a light-emitting film, a method of manufacturing the light-emitting film, a lighting device, and a display device.

Technical Solution

The present application relates to a light-emitting film. The term "light-emitting film" refers to a film formed to emit light. For example, the light-emitting film may be a film formed to absorb light with a predetermined wavelength and emit light with a wavelength the same as or different from the absorbed light.

The light-emitting film may include a light-emitting layer. In one example, the light-emitting layer may include two phase-separated regions. The term "phase-separated regions" used herein may refer to a region formed by two regions such as a relatively hydrophobic region and a relatively hydrophilic region, which are observed to be separated from each other. Hereinafter, for convenience of description, any one of the two phase-separated regions of the light-emitting layer may be called a first region, and the other may be called a second region. When the light-emitting layer is an emulsion as will be described below, any one of the first and second regions may be a continuous phase, and the other may be a dispersed phase.

The first region of the first and second regions may be a hydrophilic region, and the second region of these regions may be a hydrophobic region. In the present application, hydrophilicity and hydrophobicity that distinguish the first and second regions are relative concepts, and the absolute standards of the hydrophilicity and the hydrophobicity are not particularly limited, as long as the two regions are separated from each other in the light-emitting layer.

A ratio of the first hydrophilic region to the second hydrophobic region in the light-emitting layer may be selected by considering, for example, a ratio of light-emitting nanoparticles that would be included in the light-emitting layer, an adhesive property to another layer such as a barrier layer, efficiency of generating a phase separation structure or physical properties required for film formation. For example, the light-emitting layer may include 10 to 100 parts by weight of the second region with respect to 100 parts by weight of the first region. In another example, the light-emitting layer may include 50 to 95 parts by weight of the first region and 5 to 50 parts by weight of the second region. In contrast, the light-emitting layer may include 50 to 95 parts by weight of the second region and 5 to 50 parts by weight of the first region. The term "parts by weight" used herein refers to, unless particularly defined otherwise, a weight ratio between components. Also, here, the weight ratio of the first and second regions may refer to a weight ratio of each region; a ratio of the sum of all components included in each region; a ratio of a weight between a component included as a main component of each region; or a weight ratio of a material used to form each region. For example, the light-emitting layer, as will be described below, may be formed by polymerizing a mixture of a relatively hydrophilic polymerizable composition and a relatively hydrophobic polymerizable composition, and in this case, a weight ratio of each region may refer to a weight ratio of each polymerizable composition, or a weight ratio between main components included in each composition, such as a hydrophilic polymerizable compound and a hydrophobic polymerizable compound. Here, the hydrophilic polymerizable composition may refer to a composition including the hydrophilic polymerizable compound as the main component, and the hydrophobic polymerizable composition may refer to a composition including the hydrophobic polymerizable compound as the main component. Here, the type of the polymerizable compound may be, but is not particularly limited to, for example, a radical polymerizable compound. In the present application, the expression "including a component as the main component" may indicate that the weight ratio of a component included as a main component is 55, 60, 65, 70, 75, 80, 85, or 95 wt % or more based on the total weight. In the present application, the criterion for distinguishing hydrophilicity and hydrophobicity between the hydrophilic polymerizable compound and the hydrophobic polymerizable compound is not particularly limited as long as the above-described phase-separated region can be formed when the both compounds are relatively hydrophilic or hydrophobic, and mixed with each other. In one example, the distinction between the hydrophilicity and the hydrophobicity may be performed by a solubility parameter. In the present application, the solubility parameter may refer to a solubility parameter of a homopolymer formed by polymerization of a corresponding polymerizable compound, and therefore, degrees of hydrophilicity and hydrophobicity of the corresponding compound may be estimated. A method of measuring the solubility parameter is not particularly limited, and may follow a method known in the art. For example, the parameter may be calculated or obtained by a method known as a Hansen solubility parameter (HSP) in the art. While not particularly limited, the hydrophobic polymerizable compound in the present application may refer to a polymerizable compound than can form a polymer having a solubility parameter of less than about 10 $(cal/cm^3)^{1/2}$ through polymerization, and the hydrophilic polymerizable compound may refer to a polymerizable compound that can form a polymer having a solubility parameter of about 10 $(cal/cm^3)^{1/2}$ or more through polymerization. The solubility parameter of the polymer formed by the hydrophobic polymerizable compound may be, in another example, about 3, 4, or 5 $(cal/cm^3)^{1/2}$ or more. The solubility parameter of the polymer formed by the hydrophilic polymerizable compound may be, in another example, about 11, 12, 13, 14, or 15 $(cal/cm^3)^{1/2}$ or more. The solubility parameter of the polymer formed by the hydrophilic polymerizable compound may be, in another example, about 40, 35, or 30 $(cal/cm^3)^{1/2}$ or less. To implement a suitable phase-separation structure or emulsion structure, a difference in solubility parameter between the hydrophobic and hydrophilic compounds may be controlled. In one example, the difference in solubility parameter between the hydrophilic and hydrophobic polymerizable compounds or polymers formed by each of the polymerizable compounds may be about 5, 6, 7, or 8 $(cal/cm^3)^{1/2}$ or more. The difference is a value obtained by subtracting the smallest value of the solubility parameters from the largest value thereof. The upper limit of the difference is not particularly limited. As the difference in solubility parameter is larger, a more suitable phase separation structure or emulsion structure may be formed. The upper limit of the difference may be, for example, about 30, 25, or 20 $(cal/cm^3)^{1/2}$ or less. When a physical property described in the specification is a physical property changed by a temperature, the physical property may refer to a physical property at room temperature. The term "room temperature" used herein is a natural temperature, which is not increased or decreased, and may be a temperature in the range of about 10 to 30° C., for example, about 23 or 25° C.

In one example, the light-emitting layer may be an emulsion-type layer. Meanwhile, the term "emulsion-type layer" used herein may be a layer in which any one region of at least two phases (e.g., the first and second regions), which do not mix, has a continuous phase in the layer, and the other region is dispersed in the continuous phase, thereby forming a dispersed phase. Here, the continuous phase and the dispersed phase may be a solid, semi-solid or liquid phase, and the same phase or a different phase. Conventionally, while the emulsion is a term generally used for at least two liquids, which do not mix with each other, the emulsion used herein is not necessarily an emulsion formed by at least two liquids.

In one example, the light-emitting layer may include a matrix forming the continuous phase, and an emulsion region, which is the dispersed phase, dispersed in the matrix. Here, the matrix may be any one region (e.g., the first region) of the above described first and second regions, and the dispersed phase-emulsion region may be the other region of the first and second regions (e.g., the second region).

The emulsion region may be formed of particles. That is, the emulsion region may be formed of particles and dispersed in the matrix. In this case, the shape of the particles in the emulsion region may be, but is not particularly limited to, generally a spherical, oval, polygonal or amorphous shape. The average diameter of the particle may be in a range of about 1 to 200 μm, about 1 to 50 μm, or about 50 to 200 μm. The size of the particle may be controlled by adjusting a ratio of materials for forming the matrix and the emulsion region, or using a surfactant.

The ratio of the matrix and the emulsion region in the light-emitting layer may be selected by considering, for example, a ratio of light-emitting nanoparticles that would be included in the light-emitting layer, an adhesive property to another layer such as a barrier layer, efficiency of generating a phase-separated structure, which is an emulsion structure, or physical properties required for film formation. For example, the light-emitting layer may include 5 to 40 parts by weight of the emulsion region with respect to 100 parts by weight of the matrix. The ratio of the emulsion region may be 10 parts by weight or more, or 15 parts by weight or more with respect to 100 parts by weight of the matrix. The ratio of the emulsion region may be 35 parts by weight or less with respect to 100 parts by weight of the matrix. Here, the weight ratio of the matrix and the emulsion region may be a weight ratio of each region, the sum of weights of all components or a ratio of the main component included in the region, or a weight ratio of the material used to form each region. For example, the matrix and the emulsion region may include polymerization units of the hydrophilic and hydrophobic polymerizable compounds, which will be described below, respectively, and the weight ratio may be a ratio between the polymerization units.

The light-emitting layer may include light-emitting nanoparticles. The term "light-emitting nanoparticles" may refer to nanoparticles capable of emitting light. For example, the light-emitting nanoparticles may refer to nanoparticles formed to absorb light with a predetermined wavelength and emit light with a wavelength the same as or different from the absorbed light. The term "nanoparticles" used herein may be particles having a nanoscale dimension, and, for example, having an average diameter of about 100, 90, 80, 70, 60, 50, 40, 30, 20, or 15 nm or less. The shape of the nanoparticles is not particularly limited, and may be a spherical, oval, polygonal or amorphous shape.

The light-emitting nanoparticles may be included in the matrix or emulsion region. In one example, the light-emitting nanoparticles may be included only in any one of the matrix and the emulsion region, and may not be substantially included in the other region. The expression "light-emitting nanoparticles are not substantially included in a region" used herein may indicate that a weight ratio of the light-emitting nanoparticles included in the corresponding region with respect to the total weight of the light-emitting nanoparticles included in the light-emitting layer is, for example, 10, 9, 8, 7, 6, 5, 4, 3, 2, 1, 0.5, or 0.1% or less.

In one example, the light-emitting nanoparticles may be substantially included in the emulsion region among the matrix and the emulsion region. In this case, the light-emitting nanoparticles may not be substantially included in the matrix. Accordingly, in this case, the ratio of the light-emitting nanoparticles included in the emulsion region may be 90, 91, 92, 93, 94, 95, 96, 97, 98, 99, 99.5, or 99.9 wt % or more based on the total weight of the light-emitting nanoparticles included in the light-emitting layer.

When two phase-separated regions are formed in the light-emitting layer, and the light-emitting nanoparticles are substantially disposed only in any one region of the two regions, the physical properties suitable for film formation may be ensured, and it is advantageous to ensure a cohesive property between a different layer such as a barrier layer that will be described below and the light-emitting layer, and other factors that can adversely influence the physical properties of the nanoparticles such as an initiator or crosslinking agent in the region having the light-emitting nanoparticles during the formation of the light-emitting film may be further effectively controlled, thereby forming a film having excellent durability.

Any one of the matrix and the emulsion region may include a hydrophilic polymer, and the other region may include a hydrophobic polymer. As described above, the hydrophilic polymer may refer to a polymer having an HSP of 10 $(cal/cm^3)^{1/2}$ or more, and the hydrophobic polymer may refer to a polymer having an HSP of less than 10 $(cal/cm^3)^{1/2}$. In another example, the solubility parameter of the hydrophobic polymer may be about 3, 4, or 5 $(cal/cm^3)^{1/2}$ or more. In another example, the solubility parameter of the hydrophilic polymer may be about 11, 12, 13, 14, or 15 $(cal/cm^3)^{1/2}$ or more. In another example, the solubility parameter of the hydrophilic polymer may be about 40, 35, or 30 $(cal/cm^3)^{1/2}$ or less. To implement a suitable phase-separated structure or emulsion structure, a difference in solubility parameter between the hydrophobic and hydrophilic polymers may be controlled. In one example, the difference in solubility parameter between the hydrophilic and hydrophobic polymers may be about 5, 6, 7, or 8 $(cal/cm^3)^{1/2}$ or more. The difference is a value obtained by subtracting the smallest value of the solubility parameter from the largest value thereof. The upper limit of the difference is not particularly limited. As the difference in solubility parameter is increased, a more suitable phase-separated structure or emulsion structure may be formed. The upper limit of the difference may be, for example, 30, 25, or 20 $(cal/cm^3)^{1/2}$ or less. In one example, the matrix may include a hydrophilic polymer, and the emulsion region may include a hydrophobic polymer.

The matrix may be formed by polymerizing the hydrophilic polymerizable compound, for example, a hydrophilic radical polymerizable compound. In this case, the matrix may include a polymerization unit of a compound of Formula 1, a compound of Formula 2, a compound of Formula 3, a compound of Formula 4, a nitrogen-containing radical polymerizable compound, or a radical polymerizable compound including an acrylic acid, a methacrylic acid or a salt. The term "polymerization unit of a predetermined compound" used herein may refer to a unit formed by polymerizing the predetermined compound.

[Formula 1]

In Formula 1, Q is hydrogen or an alkyl group, U is an alkylene group, Z is hydrogen, an alkoxy group, an epoxy group or a monovalent hydrocarbon group, and m is an arbitrary number.

[Formula 2]

In Formula 2, Q is hydrogen or an alkyl group, U is an alkylene group, and m is an arbitrary number.

[Formula 3]

In Formula 3, Q is hydrogen or an alkyl group, A is an alkylene group substituted with a hydroxyl group, and U is an alkylene group.

[Formula 4]

In Formula 4, Q is hydrogen or an alkyl group, A and U are each independently an alkylene group, and X is a hydroxyl group or a cyano group.

The term "alkylene group" used herein may be, unless particularly defined otherwise, an alkylene group having 1 to 20, 1 to 16, 1 to 12, 1 to 8, or 1 to 4 carbon atoms. The alkylene group may be linear, branched or cyclic. Also, the alkylene group may be arbitrarily substituted with at least one substituent.

The term "epoxy group" used herein may be, unless particularly defined otherwise, a compound including a cyclic ether having three ring-forming atoms, a compound including the cyclic ether, or a monovalent residue derived therefrom. As the epoxy group, a glycidyl group, an epoxyalkyl group, a glycidoxyalkyl group or an alicyclic epoxy group may be used. Here, the alicyclic epoxy group may refer to a monovalent residue derived from a compound having a structure including an aliphatic hydrocarbon ring structure, and an epoxy group formed by two carbon atoms of the aliphatic hydrocarbon ring. As the alicyclic epoxy group, an alicyclic epoxy group having 6 to 12 carbon atoms, for example, a 3,4-epoxycyclohexylethyl group may be used.

The term "alkoxy group" used herein may be, unless particularly defined otherwise, an alkoxy group having 1 to 20, 1 to 16, 1 to 12, 1 to 8, or 1 to 4 carbon atoms. The alkoxy group may be linear, branched or cyclic. Also, the alkoxy group may be arbitrarily substituted with at least one substituent.

The term "alkyl group" used herein may be, unless particularly defined otherwise, an alkyl group having 1 to 20, 1 to 16, 1 to 12, 1 to 8, or 1 to 4 carbon atoms. The alkyl group may be linear, branched or cyclic. Also, the alkyl group may be arbitrarily substituted with at least one substituent.

The term "monovalent hydrocarbon group" used herein may be, unless particularly defined otherwise, a monovalent residue derived from a compound formed of carbon and hydrogen or a derivative of the compound. For example, the monovalent hydrocarbon group may include 1 to 25 carbon atoms. As the monovalent hydrocarbon group, an alkyl group, an alkenyl group, an alkynyl group or an aryl group may be used.

The term "alkenyl group" used herein may be, unless particularly defined otherwise, an alkenyl group having 2 to 20, 2 to 16, 2 to 12, 2 to 8, or 2 to 4 carbon atoms. The alkenyl group may be linear, branched or cyclic, and may be arbitrarily substituted with at least one substituent.

The term "alkynyl group" used herein may be, unless particularly defined otherwise, an alkynyl group having 2 to 20, 2 to 16, 2 to 12, 2 to 8, or 2 to 4 carbon atoms. The alkynyl group may be linear, branched or cyclic, and may be arbitrarily substituted with at least one substituent.

The term "aryl group" used herein may be, unless particularly defined otherwise, a monovalent residue derived from a compound including a structure in which a benzene ring is included, or at least two benzene rings are fused or coupled to each other, or a derivative thereof. The scope of the aryl group described in the specification may include a functional group conventionally called as an aryl group, and an aralkyl group or arylalkyl group. The aryl group may be, for example, an aryl group having 6 to 25, 6 to 21, 6 to 18, or 6 to 12 carbon atoms. The aryl group may be a phenyl group, a phenoxy group, a phenoxyphenyl group, a phenoxybenzyl group, a dichlorophenyl group, a chlorophenyl group, a phenylethyl group, a phenylpropyl group, a benzyl group, a tolyl group, a xylyl group, or a naphthyl group.

In the present application, the alkoxy group, the alkylene group, the epoxy group, or the monovalent hydrocarbon group may be arbitrarily substituted by substituents such as a halogen such as chlorine or fluorine, an epoxy group such as a glycidyl group, an epoxyalkyl group, a glycidoxyalkyl group or an alicyclic epoxy group, an acryloyl group, a methacryloyl group, an isocyanate group, a thiol group, or a monovalent hydrocarbon group, but the present application is not limited thereto.

In Formulas 1, 2 and 4, m and n are arbitrary numbers, and are each independently, for example, a number in a range of 1 to 20, 1 to 16, or 1 to 12.

As the nitrogen-containing radical polymerizable compound, for example, an amide group-containing radical polymerizable compound, an amino group-containing radical polymerizable compound, an imide group-containing radical polymerizable compound or a cyano group-containing radical polymerizable compound may be used. Here, as the amide group-containing radical polymerizable compound, for example, (meth)acrylamide or N,N-dimethyl (meth)acrylamide, N,N-diethyl (meth)acrylamide, N-isopropyl (meth)acrylamide, N-methylol (meth)acrylamide, diacetone (meth)acrylamide, N-vinylacetoamide, N,N'-methylene bis(meth)acrylamide, N,N-dimethylaminopropyl (meth)acrylamide, N,N-dimethylaminopropyl methacrylamide, N-vinylpyrrolidone, N-vinylcaprolactam, or (meth)acryloylmorpholine may be used, as the amino group-containing radical polymerizable compound, aminoethyl (meth)acrylate, N,N-dimethylaminoethyl (meth)acrylate or N,N-dimethylaminopropyl (meth)acrylate may be used, as the imide group-containing radical polymerizable compound, N-isopropylmaleimide, N-cyclohexylmaleimide or itaconimide may be used, and as the cyano group-containing radical polymerizable compound, acrylonitrile or methacrylonitrile may be used, but the present application is not limited thereto.

Also, for the radical polymerizable compound including a salt, a salt of an acrylic acid or methacrylic acid, for example, a salt formed of the above-described salt and an alkali metal such as lithium, sodium or potassium, or a salt formed of the above-described salt and an alkali earth metal such as magnesium, calcium, strontium or barium may be used, but the present application is not limited thereto.

The matrix including the polymerization unit may be formed by polymerizing, for example, a hydrophilic polymerizable compound such as a radical polymerizable compound and a hydrophilic polymerizable composition including a radical initiator. Accordingly, the matrix may be a polymerized product of the hydrophilic polymerizable composition.

The type of the hydrophilic radical polymerizable compound is not particularly limited, and for example, may include the above-described compounds.

The type of the radical initiator included in the hydrophilic polymerizable composition is not particularly limited. As the initiator, a radical thermal initiator or a photo initiator capable of generating a radical, which may initiate the polymerization reaction through supply of heat or irradiation with light, may be used.

As the thermal initiator, for example, one or at least two of an azo-based initiator such as 2,2-azobis-2,4-dimethylvaleronitrile (V-65, Wako), 2,2-azobis isobutyronitrile (V-60, Wako) or 2,2-azobis-2-methylbutyronitrile (V-59, Wako); a peroxyester compound such as dipropyl peroxydicarbonate (Peroyl NPP, NOF), diisopropyl peroxydicarbonate (Peroyl IPP, NOF), bis-4-butylcyclohexyl peroxydicarbonate (Peroyl TCP, NOF), diethoxyethyl peroxydicarbonate (Peroyl EEP, NOF), diethoxyhexyl peroxydicarbonate (Peroyl OPP, NOF), hexyl peroxydicarbonate (Perhexyl ND, NOF), dimethoxybutyl peroxydicarbonate (Peroyl MBP, NOF), bis(3-methoxy-3-methoxybutyl) peroxydicarbonate (Peroyl SOP, NOF), hexyl peroxy pivalate (Perhexyl PV, NOF), amyl peroxy pivalate (Luperox 546M75, Atofina), butyl peroxy pivalate (Perbutyl, NOF) or trimethylhexanoyl peroxide (Peroyl 355, NOF); a peroxydicarbonate compound such as dimethyl hydroxybutyl peroxaneodecanoate (Luperox 610M75, Atofina), amyl peroxy neodecanoate (Luperox 546M75, Atofina) or butyl peroxy neodecanoate (Luperox 10M75, Atofina); an acyl peroxide such as 3,5,5-trimethylhexanoyl peroxide, lauryl peroxide or dibenzoyl peroxide; a ketone peroxide; a dialkyl peroxide; a peroxy ketal; or a peroxide initiator such as hydroperoxide, may be used, and as the photoinitiator, a benzoin-, hydroxy ketone-, aminoketone- or phosphine oxide-based photoinitiator and specifically, benzoin, benzoin methylether, benzoin ethylether, benzoin isopropylether, benzoin n-butylether, benzoin isobutylether, acetophenone, dimethylamino acetophenone, 2,2-dimethoxy-2-phenylacetophenone, 2,2-diethoxy-2-phenylacetophenone, 2-hydroxy-2-methyl-1-phenylpropane-1-one, 1-hydroxycyclohexylphenylketone, 2-methyl-1-[4-(methylthio)phenyl]-2-morpholino-propane-1-one, 4-(2-hydroxyethoxy)phenyl-2-(hydroxy-2-propyl)ketone, benzophenone, p-phenylbenzophenone, 4,4'-diethylaminobenzophenone, dichlorobenzophenone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyldimethylketal, acetophenone dimethylketal, p-dimethylamino benzoic acid ester, oligo[2-hydroxy-2-methyl-1-[4-(1-methylvinyl)phenyl]propanone], or 2,4,6-trimethylbenzoyl-diphenyl-phosphineoxide, may be used, but the present application is not limited thereto.

As the initiator, one having high solubility with respect to a hydrophilic component, for example, a hydroxyketone compound, a hydroxyketone dispersion compound, an aminoketone compound, or an aminoketone dispersion compound may be selected and used, but the present application is not limited thereto.

The hydrophilic polymerizable composition may include, for example, a radical initiator at a concentration of about 0.1 to 10 wt %. Such a ratio may be changed by considering, for example, physical properties or polymerization efficiency of the film.

For example, considering physical properties for film formation, when needed, the hydrophilic polymerizable composition may further include a crosslinking agent. As the crosslinking agent, for example, a compound having at least two radical polymerizable groups may be used.

As a compound that can be used as the crosslinking agent, a multifunctional acrylate may be used. The multifunctional acrylate may be a compound including at least two acryloyl groups or methacryloyl groups.

For example, the multifunctional acrylate may be a bifunctional acrylate such as 1,4-butanediol di(meth)acrylate, 1,6-hexanediol di(meth)acrylate, neopentylglycol di(meth)acrylate, polyethyleneglycol di(meth)acrylate, neopentylglycol adipate di(meth)acrylate, hydroxypivalic acid neopentylglycol di(meth)acrylate, dicyclopentanyl di(meth)acrylate, caprolactone-modified dicyclopentenyl di(meth)acrylate, ethyleneoxide-modified di(meth)acrylate, di(meth)acryloxy ethyl isocyanurate, allylated cyclohexyl di(meth)acrylate, tricyclodecanedimethanol (meth)acrylate, dimethylol dicyclopentane di(meth)acrylate, ethyleneoxide-modified hexahydrophthalic acid di(meth)acrylate, tricyclodecane dimethanol(meth)acrylate, neopentylglycol-modified trimethylpropane di(meth)acrylate, adamantane di(meth)acrylate, or 9,9-bis[4-(2-acryloyloxyethoxy)phenyl]fluorine; a trifunctional acrylate such as trimethylolpropane tri(meth)acrylate, dipentaerythritol tri(meth)acrylate, propionic acid-modified dipentaerythritol tri(meth)acrylate, pentaerythritol tri(meth)acrylate, propyleneoxide-modified trimethylolpropane tri(meth)acrylate, trifunctional urethane (meth)acrylate, or tris(meth)acryloxyethylisocyanurate; a tetrafunctional acrylate such as diglycerin tetra(meth)acrylate or pentaerythritol tetra(meth)acrylate; a pentafunctional acrylate such as propionic acid-modified dipentaerythritol penta(meth)acrylate; or a hexafunctional acrylate such as dipentaerythritol hexa(meth)acrylate, caprolactone-modified dipentaerythritol hexa(meth)acrylate, or urethane (meth)acrylate (e.g. a reaction product of an isocyanate monomer and trimethylolpropane tri(meth)acrylate). In addition, as the multifunctional acrylate, a compound referred to as a photocurable oligomer, urethane acrylate, epoxy acrylate, polyester acrylate or polyether acrylate may be used. Among the above-described compounds, one or at least two suitable types may be selected and used.

As a crosslinking agent, a component capable of implementing a crosslinking structure by a radical reaction, such as the multifunctional acrylate, and when needed, a component capable of implementing a crosslinking structure by a thermal curing reaction, such as a known isocyanate crosslinking agent, an epoxy crosslinking agent, an aziridine crosslinking agent or a metal chelate crosslinking agent, may be used.

The crosslinking agent may be included in the hydrophilic polymerizable composition at, for example, a concentration of 50 wt % or less, or 10 to 50 wt %. The ratio of the crosslinking agent may be changed by considering, for example, the physical properties of the film.

The hydrophilic polymerizable composition may further include another necessary component, as well as the above-described components. Also, a method of forming the first region using the hydrophilic polymerizable composition will be described below.

The emulsion region may also be formed by polymerizing a polymerizable compound, for example, a radical polymerizable compound. For example, the emulsion region may be formed by polymerizing the hydrophobic radical polymerizable compound.

In one example, the emulsion region may include a polymerization unit of a compound represented by any one of Formulas 5 to 7.

[Formula 5]

In Formula 5, Q is hydrogen or an alkyl group, and B is a linear or branched alkyl group or alicyclic hydrocarbon group having 5 or more carbon atoms.

[Formula 6]

In Formula 6, Q is hydrogen or an alkyl group, and U is an alkylene, alkenylene, alkynylene or arylene group.

[Formula 7]

In Formula 7, Q is hydrogen or an alkyl group, U is an alkylene group, Y is a carbon atom, an oxygen atom or a sulfur atom, X is an oxygen atom, a sulfur atom or an alkylene group, Ar is an aryl group, and n is an arbitrary number.

The term "alkenylene or alkynylene group" used herein may be, unless particularly defined otherwise, an alkenylene or alkynylene group having 2 to 20, 2 to 16, 2 to 12, 2 to 8, or 2 to 4 carbon atoms. The alkenylene or alkynylene group may be linear, branched or cyclic. Also, the alkenylene or alkynylene group may be arbitrarily substituted with at least one substituent.

The term "arylene group" used herein may be, unless particularly defined otherwise, a bivalent residue derived from a compound including benzene or a structure in which at least two benzenes are condensed or coupled or a derivative thereof. The arylene group may have, for example, a structure including benzene, naphthalene or fluorene.

In Formula 5, B may be a linear or branched alkyl group having 5, 7, or 9 or more carbon atoms. A compound including a relatively long chain alkyl group is known as a relatively non-polar compound. The upper limit of the carbon number of the linear or branched alkyl group is not particularly limited, and for example, the alkyl group may be an alkyl group having 20 or less carbon atoms.

In another example, in Formula 5, B may be an alicyclic hydrocarbon group, for example, an alicyclic hydrocarbon group having 3 to 20, 3 to 16, or 6 to 12 carbon atoms, such a hydrocarbon group may be a cyclohexyl group or an isobornyl group. As described above, the compound having an alicyclic hydrocarbon group is known as a relatively non-polar compound.

In Formula 7, n is an arbitrary number, and may be each independently, for example, in a range of 1 to 20, 1 to 16, or 1 to 12.

The second region may be formed by polymerizing, for example, a hydrophobic radical polymerizable compound and a hydrophobic polymerizable composition including a radical initiator. Accordingly, the second region may be a polymerized product of the hydrophobic polymerizable composition.

The type of the hydrophobic radical polymerizable compound included in the hydrophobic polymerizable composition is not particularly limited, and a compound known as a non-polar monomer in the art may be used. For example, the compound may include the above-described compounds.

The type of the radical initiator included in the hydrophobic polymerizable composition is not particularly limited. For example, a suitable one may be selected from the initiators described in the description of the hydrophilic polymerizable compound.

The hydrophobic polymerizable composition may include a radical initiator, for example, at a concentration of 5 wt % or less. Such a concentration may be changed by considering, for example, the physical properties or polymerization efficiency of the film.

Considering the physical properties for film formation, when needed, the hydrophobic polymerizable composition may further include a crosslinking agent. As the crosslinking agent, without particular limitation, for example, a suitable one may be selected from the components shown in the description of the hydrophilic polymerizable composition.

The crosslinking agent may be included in the hydrophobic polymerizable composition, for example, at a concentration of 50 wt % or less, or 10 to 50 wt %. The concentration of the crosslinking agent may be changed by considering, for example, the physical properties of the film, or the influence on other components included in the polymerizable compound.

The hydrophobic polymerizable composition may further include other components, when needed. Also, a method of forming the emulsion region using the hydrophobic polymerizable composition will be described below.

The light-emitting layer includes light-emitting nanoparticles. As described above, the light-emitting nanoparticles may be particles which may absorb light with a predetermined wavelength and emit light with a wavelength the same as or different from the predetermined wavelength. For example, the light-emitting nanoparticles may be nanoparticles (hereinafter, may be called green particles) which may absorb light with any one wavelength in a range of 420 to 490 nm and emit light with any one wavelength in a range of 490 to 580 nm and/or nanoparticles (hereinafter, may be called red particles) which may absorb light with any one wavelength in a range of 450 to 490 nm and emit light with any one wavelength in a range of 580 to 780 nm. For example, to obtain a light-emitting film capable of emitting white light, both of the red particles and green particles may be included in the light-emitting layer in a suitable ratio. In one example, the light-emitting layer of the light-emitting film capable of emitting white light may include 300 to 1500 parts by weight of the green particles with respect to 100 parts by weight of the red particles. As the light-emitting nanoparticles, any having such actions may be used without particular limitation. A representative example of such nanoparticles may be a nanostructure called quantum dots.

In the specification, for convenience of description, the nanostructure is called nanoparticles, but may be a particle type, for example, nanowires, nanorods, nanotubes, a branched nanostructure, nanotetrapods, tripods or bipods, which may also be included in the nanoparticles defined in the present application. The term "nanostructure" used herein may include similar structures having at least one region having a dimension of less than about 500, 200, 100, 50, 20, or 10 nm, or a specific dimension. Generally, the region or specific dimensions may be present along the smallest axis of the structure, but the present application is not limited thereto. The nanostructure may be, for example, substantially crystalline, substantially monocrystalline, polycrystalline, amorphous, or a combination thereof.

The quantum dots that can be used as the light-emitting nanoparticles may be manufactured by any known method. For example, suitable methods for forming the quantum dots are known in U.S. Pat. No. 6,225,198, U.S. Unexamined Patent Application No. 2002-0066401, U.S. Pat. No. 6,207, 229, U.S. Pat. No. 6,322,901, U.S. Pat. No. 6,949,206, U.S. Pat. No. 7,572,393, U.S. Pat. No. 7,267,865, U.S. Pat. No. 7,374,807 or U.S. Pat. No. 6,861,155, and in addition to these, various known methods may be applied to the present application.

The quantum dots or other nanoparticles that can be used in the present application may be formed using an arbitrary suitable material, for example, an inorganic material such as an inorganic conductive or semiconductive material. As suitable semiconductor materials, a group II-VI, III-V, IV-VI or IV semiconductors may be used. Specifically, Si, Ge, Sn, Se, Te, B, C (including diamond), P, BN, BP, BAs, AlN, AlP, AlAs, AlSb, GaN, GaP, GaAs, GaSb, InN, InP, InAs, InSb, (AlN, AlP, AlAs, AlSb, GaN, GaP, GaAs, GaSb 중복삭제) ZnO, ZnS, ZnSe, ZnTe, CdS, CdSe, CdSeZn, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $(Al, Ga, In)_2 (S, Se, Te)_3$, $Al_2CO$, and suitable combinations of at least two semiconductors may be used, but the present application is not limited thereto.

In one example, semiconductor nanocrystals or different nanostructures may include dopants such as p-type dopants or n-type dopants. The nanoparticles that can be used in the present application may also include group II-VI or III-V semiconductors. The group II-VI or III-V semiconductor nanocrystals and nanostructures may be an arbitrary composition of group II atoms such as Zn, Cd and Hg and group VI atoms such as S, Se, Te, and Po; and an arbitrary combination of group III atoms such as B, Al, Ga, In, and Tl and group V atoms such as N, P, As, Sb and Bi, but the present application is not limited thereto. In another example, suitable inorganic nanostructures may include metal nanostructures, and suitable metals may include Ru, Pd, Pt, Ni, W, Ta, Co, Mo, Ir, Re, Rh, Hf, Nb, Au, Ag, Ti, Sn, Zn, Fe, and FePt, but the present application is not limited thereto.

The light-emitting nanoparticles such as the quantum dots, may have a core-shell structure. As an example, a material capable of forming light-emitting nanoparticles having a core-shell structure includes Si, Ge, Sn, Se, Te, B, C (including diamond), P, Co, Au, BN, BP, BAs, AlN, AlP, AlAs, AlSb, GaN, GaP, GaAs, GaSb, InN, InP, InAs, InSb, (중복삭제) ZnO, ZnS, ZnSe, ZnTe, CdS, CdSe, CdSeZn, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $(Al, Ga, In)_2 (S, Se, Te)_3$, $Al_2CO$, and an arbitrary combination of at least two thereof, but the present application is not limited thereto. An exemplary core-shell light-emitting nanoparticles (core/shell) applicable to the present application includes CdSe/ZnS, InP/ZnS, PbSe/PbS, CdSe/CdS, CdTe/CdS or CdTe/ZnS, but the present application is not limited thereto.

A specific type of the light-emitting nanoparticles is not particularly limited, and may be suitably selected by considering desired light-emitting characteristics.

In one example, the light-emitting nanoparticles such as quantum dots may be covered by at least one ligand or barrier. The ligand or barrier may be advantageous for improving stability of the light-emitting nanoparticles such as quantum dots, and protecting the light-emitting nanoparticles from harmful external conditions including high temperature, high intensity, external gas or moisture. Also, as will be described below, the light-emitting nanoparticles may be present only in any one region of the matrix or the emulsion region, and to obtain the light-emitting layer, the ligand or barrier may be selected to have compatibility only to any one of the matrix and the emulsion region.

In one example, the light-emitting nanoparticles such as the quantum dots may include ligands conjugated, cooperated, linked or bonded to the surface thereof. The ligands that can allow the surface of the light-emitting nanoparticles such as the quantum dots to have suitable characteristics and a method of forming the same are known, and such a method may be applied to the present application without limitation. Such a material or methods are disclosed, for example, in U.S. Unexamined Patent Application No. 2008-0281010, U.S. Unexamined Patent Application No. 2008-0237540, U.S. Unexamined Patent Application No. 2010-0110728, U.S. Unexamined Patent Application No. 2008-0118755, U.S. Pat. No. 7,645,397, U.S. Pat. No. 7,374,807, U.S. Pat. No. 6,949,206, U.S. Pat. No. 7,572,393 or U.S. Pat. No. 7,267,875, but the present application is not limited thereto. In one example, the ligand may be formed by a molecule or polymer having an amine group (oleylamine, triethylamine, hexylamine, naphthylamine, etc.), a molecule or polymer having a carboxyl group (oleic acid, etc.), a molecule or polymer having a thiol group (butanethiol, hexanethiol, dodecanethiol, etc.), a molecule or polymer having a pyridine group, a molecule having a phosphine group (triphenylphosphine, etc.), a molecule having a phosphine oxide group (trioctylphosphine oxide, etc.), a molecule having a carbonyl group (alkyl ketone, etc.), a molecule having a benzene ring (benzene, styrene, etc.), or a molecule or polymer having a hydroxyl group (butanol, hexanol, etc.).

The light-emitting nanoparticles may be included in the light-emitting layer, for example, the matrix or the emulsion region. In one example, the light-emitting nanoparticles may be included only in any one of the matrix and the emulsion region, but not present in the other region. Here, as described above, the region not having the light-emitting nanoparticles may a region not substantially having the light-emitting nanoparticles.

A ratio of the light-emitting nanoparticles in the light-emitting layer is not particularly limited, and may be selected in a suitable range by considering desired optical characteristics. In one example, the light-emitting nanoparticles may be included in the light-emitting layer at a concentration of about 0.05 to 20 wt %, 0.05 to 15 wt %, 0.1 to 15 wt %, or 0.5 to 15 wt %, but the present application is not limited thereto.

The light-emitting layer may further include a different component in addition to the above-described components. The different component may be a known surfactant, or an antioxidant or scattering particles, which will be described below, but the present application is not limited thereto.

The light-emitting layer may also include an antioxidant, and such a component may be useful when quantum dots are applied as the light-emitting nanoparticles. Since the quantum dots are deteriorated to degrade a light-emitting property when exposed to oxygen, when the above-described antioxidant is included in the light-emitting layer, the light-emitting nanoparticles may be protected. As the antioxidant, for example, an oxidizable metal, a phenol-based antioxidant, a thioether-based antioxidant, a phosphate-based antioxidant or an amine-based antioxidant such as a hindered amine-based antioxidant may be used. The antioxidant may be included in any one of the above-described matrix and the emulsion region without limitation.

Accordingly, the light-emitting layer may include oxidizable metal particles or an oxide of the metal particles. The oxidizable metal particles may refer to a metal capable of forming an oxide by a reaction with oxygen, and may be applied when an alkali metal, an alkali earth metal or a transition metal is also oxidizable. The light-emitting nanoparticles may be protected by forming an oxide by a reaction of the metal with oxygen in the light-emitting layer. An available oxidizable metal is not particularly limited as long as it reacts with oxygen to form an oxide. As the oxidizable metal, for example, Pt, Au, Ag or Ce may be used, but the present application is not limited thereto. The size of the metal particles may be controlled by considering reactivity with oxygen, and generally, the metal particles may have an average particle diameter of about 10 to 10,000 nm.

A ratio of the oxidizable metal particles or an oxide thereof in the light-emitting layer may be selected by considering, for example, reactivity with oxygen, curability of a material for the light-emitting layer, or a light-emitting characteristic of the light-emitting layer. In one example, the oxidizable metal particles may be present in the light-emitting layer at about 0.01 to 1 wt %. When needed, a known dispersant for dispersing the oxidizable metal particles may also be used.

The light-emitting layer may also include a phenol-based antioxidant, a thioether-based antioxidant, a phosphate-based antioxidant, or a hindered amine-based antioxidant as an antioxidant. A specific type of the antioxidant may be a known material without particular limitation.

The ratio of the antioxidant in the light-emitting layer may also be selected by considering, for example, reactivity with oxygen, curability of a material for the light-emitting layer, or the light-emitting characteristic of the light-emitting layer. In one example, the antioxidant may be present in the light-emitting layer at about 0.01 to 1 wt %.

The light-emitting layer may also include scattering particles. The optical characteristic of the light-emitting layer may be further improved by controlling a probability of introducing light incident into the light-emitting layer to the light-emitting nanoparticles. The term "scattering particles" used herein may refer to all types of particles that can scatter, refract or disperse the incident light having a different refractive index from a surrounding medium, for example, the matrix or emulsion region, and having a suitable size. For example, the scattering particles may have a lower or higher refractive index than the surrounding medium, for example, the matrix and/or the emulsion region, and the absolute value of the difference in refractive index between the matrix and/or the emulsion region may be 0.2 or 0.4 or more. The upper limit of the absolute value of the difference in refractive index may be, but is not particularly limited to, for example, about 0.8 or 0.7 or less. The scattering particles may have an average diameter of, for example, about 10 nm or more, 100 nm or more, more than 100 nm, 100 to 20000 nm, 100 to 15000 nm, 100 to 10000 nm, 100 to 5000 nm, 100 to 1000 nm, or 100 to 500 nm. The scattering particles may have a spherical, oval, polygonal or amorphous shape, but the shape is not particularly limited. As the scattering particles, for example, particles including an organic material such as polystyrene or a derivative thereof, an acrylic resin or a derivative thereof, a silicone resin or a derivative thereof, or a novolac resin or a derivative thereof, or an inorganic material such as silica, alumina, titanium oxide or zirconium oxide may be used. The scattering particles may be formed to have any one of the materials, or at least two thereof. For example, as the scattering particles, hollow particles such as hollow silica or particles with a core/shell structure may also be used. A ratio of the scattering particles in the light-emitting layer is not particularly limited, and may be suitably selected by considering, for example, the pathway of light incident into the light-emitting layer.

The scattering particles may be included in, for example, the matrix or emulsion region. In one example, the scattering particles may be included in any one of the matrix and the emulsion region, and not present in the other region. Here, the region not having the scattering particles is a region in which corresponding particles are not substantially included as described above, and the scattering particles may be included in a weight ratio of 10%, 8%, 6%, 4%, 2%, 1%, or 0.5% or less based on the total weight of the region. In one example, when the light-emitting nanoparticles are included only in one of the matrix and the emulsion region, the scattering particles may be present only in the region in which the light-emitting nanoparticles are not included.

The scattering particles may be included in the light-emitting layer at 10 to 100 parts by weight with respect to the total weight of the matrix or the emulsion region, and in this ratio range, a suitable scattering characteristic may be ensured.

The light-emitting layer may further include an additive such as an oxygen scavenger or a radical scavenger at a necessary amount, in addition to the above-described components.

A thickness of the light-emitting layer may be selected in a suitable range by considering desired uses and optical characteristics without particular limitation. In one example, the light-emitting layer may have a thickness in a range of 10 to 500 µm, 10 to 400 µm, 10 to 300 µm, or 10 to 200 µm, but the present application is not limited thereto.

Figure 1:
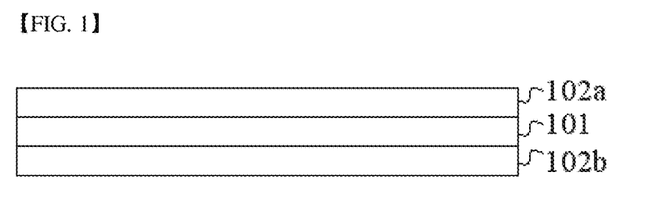
FIG. 1 is a cross-sectional view of an exemplary light-emitting film.

The light-emitting film may further include a barrier layer disposed on one or both surfaces of the light-emitting layer. Such a barrier layer may protect the light-emitting layer from a high temperature condition or conditions having harmful external factors such as oxygen and moisture. FIG. 1 shows an exemplary light-emitting film, which has a structure including a light-emitting layer 101 and barrier layers 102a and 102b disposed on both surfaces of the light-emitting layer. The barrier layers may be formed of, for example, a hydrophobic material having high stability and thus does not yellow even when exposed to light. In one example, to reduce light loss at an interface between the light-emitting layer and the barrier layer, the barrier layer may be selected to have a refractive index in a range relatively similar to that of the light-emitting layer.

The barrier layer may be formed of, for example, a solid material, or a cured liquid, gel or polymer, and may be selected from a flexible or non-flexible material depending on its use. A type of the material for the barrier layer is not particularly limited, and may be selected from known materials including glass, a polymer, an oxide or a nitride. The barrier layer may be formed of, for example, glass; a polymer such as poly(ethylene terephthalate) (PET); an oxide or nitride including silicon, titanium or aluminum, or a combination of at least two thereof, but the present application is not limited thereto.

The barrier layer may be present on both surfaces of the light-emitting layer as illustrated in FIG. 1, or any one surface thereof. Also, the light-emitting film may have a structure in which the barrier layers are present on a side surface as well as the both surfaces, and thus the light-emitting layer is entirely sealed by the barrier layer.

The present application also relates to a method of manufacturing a light-emitting film, for example, the above-described light-emitting film. The method may include, for example, polymerizing a layer including a mixture of a hydrophilic polymerizable compound and a hydrophobic polymerizable compound. Here, the hydrophilic polymerizable compound may be a compound capable of forming a polymer having the above-described solubility parameter of $10 \ (cal/cm^3)^{1/2}$ or more, and the hydrophobic polymerizable compound may be a compound cable of forming a polymer having the solubility parameter of less than $10 \ (cal/cm^3)^{1/2}$. Each compound may be, for example, a radical polymerizable compound. The mixture may further include a necessary additive, for example, light-emitting nanoparticles or an initiator.

The mixture may be prepared by simply mixing the components, or by preparing each of the hydrophobic polymerizable composition and the hydrophilic polymerizable composition and mixing them. As the hydrophilic and hydrophobic polymerizable compositions, for example, the above-described composition, that is, the composition including the hydrophilic or hydrophobic polymerizable compound and an initiator may each be used. Also, the mixture may be prepared by separately preparing the hydrophilic and hydrophobic polymerizable compositions and mixing them, or mixing components for the hydrophilic and hydrophobic polymerizable compositions. When such a mixture is polymerized, phase separation may occur during the polymerization, and the above-described type of light-emitting layer may be formed.

A method of forming the layer including the mixture is not particularly limited. For example, the layer may be formed by coating a suitable base material with the obtained mixture through a known coating method.

A method of curing the layer formed by the above-described method is not particularly limited, and may be performed by applying heat in a suitable range in which the initiator included in each composition may be activated, or applying an electromagnetic wave such as UV rays.

In the manufacturing method, the above-described light-emitting layer may be formed throughout the above-described operation. When needed, an operation of forming a barrier layer after the operation of forming the light-emitting layer may be further performed, or the polymerizing process may be performed while the light-emitting layer is adjacent to a barrier layer.

The present application also relates to a lighting device. An exemplary lighting device may include a light source and the light-emitting film. In one example, the light source and the light-emitting film of the light device may be disposed such that light emitted from the light source is incident into the light-emitting film. When the light emitted from the light source is incident into the light-emitting film, a part of the incident light is emitted without absorption to light-emitting nanoparticles in the light-emitting film, and the other part may be emitted as light with a different wavelength after being absorbed by the light-emitting nanoparticles. Accordingly, a color purity or color of the light emitted from the light-emitting film may be controlled by controlling a wavelength of the light emitted from the light source and a wavelength of the light emitted from the light-emitting nanoparticles. For example, white light may be emitted from the light-emitting film by including suitable amounts of the above-described red and green particles in the light-emitting layer, and controlling the light source to emit blue light.

The type of the light source included in the lighting device of the present application is not particularly limited, and a suitable type may be selected by considering the type of desired light. In one example, the light source is a blue light source capable of emitting light with a wavelength range of, for example, 450 to 490 nm.

Figure 2:
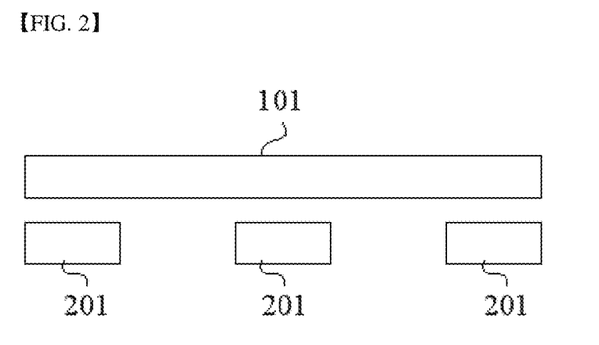
FIGS. 2 and 3 are schematic diagrams of an exemplary lighting device.
Figure 3:
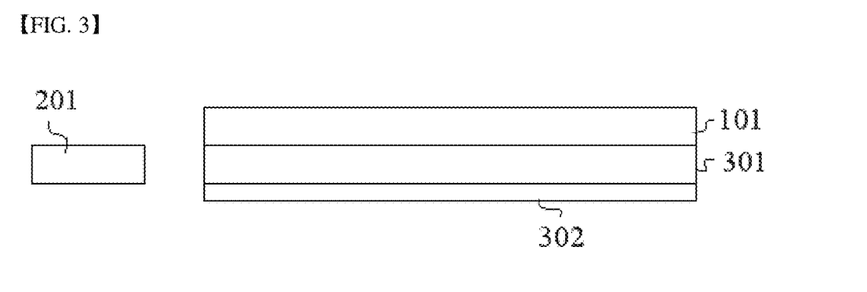

FIGS. 2 and 3 are diagrams illustrating the lighting device including the light source and the light-emitting film.

As shown in FIGS. 2 and 3, the light source and the light-emitting film in the lighting device may be disposed such that the light emitted from the light source is disposed to be incident into the light-emitting film. In FIG. 2, a light source 201 is disposed under a light-emitting film 101, and thus light emitted from the light source 201 in an upward direction may be incident into the light-emitting film 101.

In FIG. 3, the light source 201 is disposed on a side surface of the light-emitting film 101. Though not necessary, when the light source 201 is disposed on the side surface of the light-emitting film 101, a different means such as a light guiding plate 301 or a reflective plate 302, which allows the light emitted from the light source 201 to be more efficiently incident into the light-emitting film 101 may be included.

In FIGS. 2 and 3, one example of the lighting device of the present application is shown, in addition to this, various types of known lighting devices may be used, and various known configurations may be further included.

The lighting device of the present application may be used for various purposes. A representative use of the lighting device of the present application may be applied to a display device. For example, the lighting device may be used as a BLU of a display device such as a liquid crystal display (LCD).

In addition, the lighting device may be used for a BLU for a display device such as a computer, a mobile phone, a smart phone, a PDA, a gaming device, an electronic reading device, or a digital camera, interior or exterior lighting, stage lighting, decorative lighting, accent lighting or museum lighting. The lighting device may also be used for specific wavelength lighting necessary for horticulture or biology, but the uses of the lighting device to be applied are not limited thereto.

Advantageous Effects

The present application can provide a light-emitting film which can provide a lighting device having excellent color purity and efficiency, and an excellent color characteristic. The characteristics of the light-emitting film of the present application may be stably and excellently maintained for a long time. The light-emitting film of the present application may be used for various uses including photovoltaic cell applications, an optical filter, or an optical converter, as well as various lighting devices.

EXPLANATION OF REFERENCE NUMERALS

101: light-emitting layer or light-emitting film
102a, 102b: barrier layer
201: light source
301: light guiding plate
302: reflective layer

MODES OF THE INVENTION

Hereinafter, a light-emitting film of the present application will be described in detail with reference to an example and a comparative example, but the scope of the light-emitting film is not limited to the following examples.

Example 1

Figure 4:
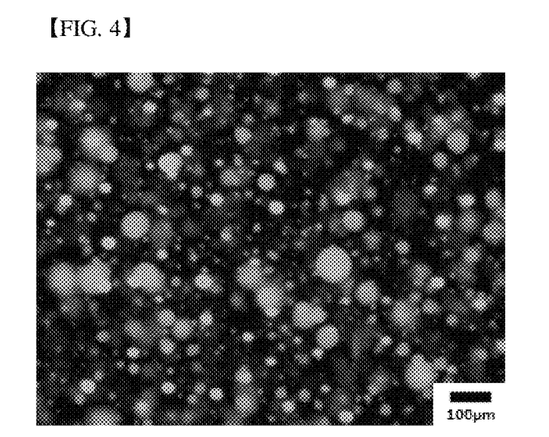
FIG. 4 is an image of the light-emitting layer manufactured according to Example 1.
Figure 5:
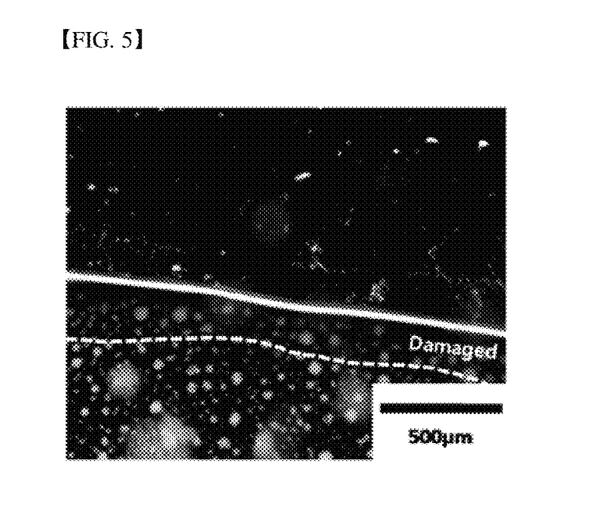
FIGS. 5 to 7 are evaluation results for light-emitting films according to examples and comparative examples.
Figure 6:
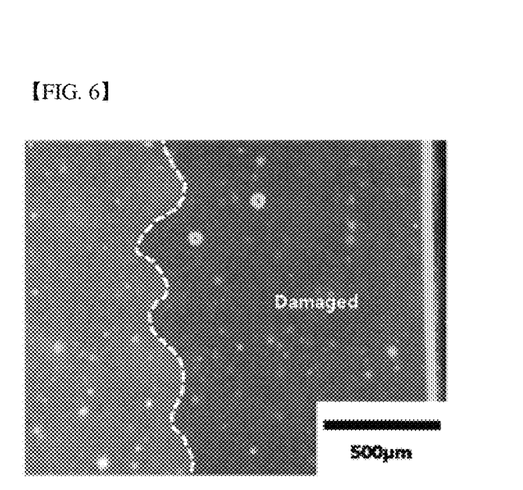
Figure 7:
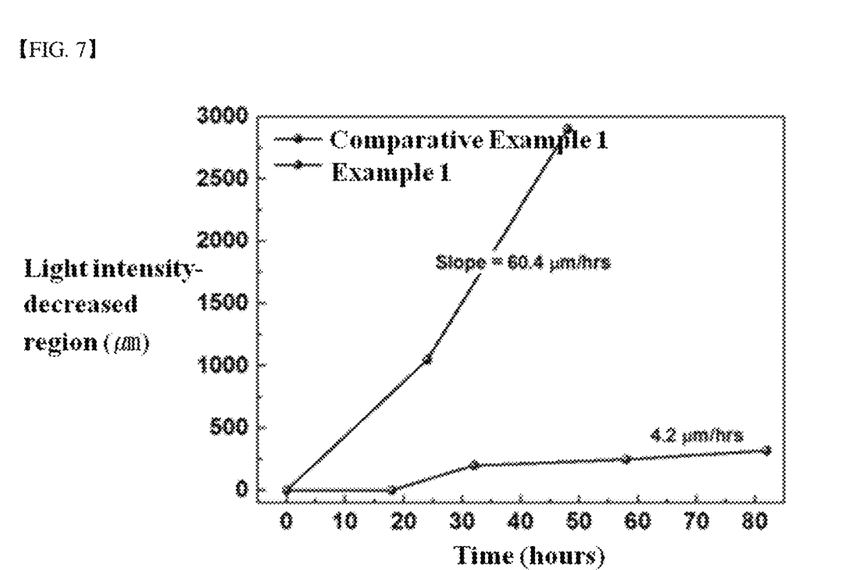

Poly(ethyleneglycol) diacrylate (PEGDA; CAS No.: 26570-48-9, solubility parameter (HSP): about 18 $(cal/cm^3)^{1/2}$), lauryl acrylate (LA; CAS No.: 2156-97-0, solubility parameter (HSP): about 8 $(cal/cm^3)^{1/2}$), bisfluorene diacrylate (BD; CAS No.: 161182-73-6, solubility parameter (HSP): about 8 to 9 $(cal/cm^3)^{1/2}$), green particles (quantum dot particles), a surfactant (polyvinylpyrrolidone) and $SiO_2$ nanoparticles were mixed in a weight ratio of 9:1:1:0.1:0.05:0.05 (PEGDA:LA:BD:green particles:surfactant: $SiO_2$ nanoparticles). Subsequently, as a radical initiator, about 1 wt % of Irgacure 2959 and Irgacure 907 each were added, mixed and stirred for about 6 hours, thereby preparing a mixture. The mixture was disposed between two barrier films (i-component) spaced apart from each other at regular intervals to have a thickness of about 100 m, UV rays were irradiated to induce radical polymerization, and the coating solution was cured, thereby forming a light-emitting layer. FIG. 4 is an image of the light-emitting layer formed by the above-described method. Referring to FIG. 4, it can be confirmed that emulsion regions in which the green particles are present are dispersed in a matrix.

Comparative Example 1

A light-emitting layer was manufactured by the same method as described in the example, except that a mixture of lauryl acrylate (LA; CAS No.: 2156-97-0, solubility parameter (HSP): about 8 $(cal/cm^3)^{1/2}$), bisfluorene diacrylate (BD; CAS No.: 161182-73-6, solubility parameter (HSP): about 8 to 9 $(cal/cm^3)^{1/2}$), trimethylolpropane triacrylate (TMPTA; CAS No.: 15625-89-5), green particles (quantum dot particles) and $SiO_2$ nanoparticles in a ratio of 10:1:0.1:0.05:0.05 (LA:BD:TMPTA:green particles:$SiO_2$ nanoparticles) was used, and thus a light-emitting film was manufactured.

Experimental Example 1

The light-emitting film manufactured in Example 1 or Comparative Example 1 was disposed on a surface of a light source emitting blue light, which emitted light, at room temperature, and the light emitted from the light source was incident for about 24 hours. Afterward, a region in which an

The invention claimed is:

1. A light-emitting film, comprising:
   an emulsion region dispersed in a matrix having a continuous phase; and
   a light-emitting layer including light-emitting nanoparticles, which are present in the continuous phase or emulsion region.

2. The film of claim 1, wherein the light-emitting nanoparticles are included in the emulsion region.

3. The film of claim 2, wherein a ratio of the light-emitting nanoparticles included in the emulsion region is 90 wt % or more with respect to a total of the light-emitting nanoparticles included in the light-emitting layer.

4. The film of claim 1, wherein the light-emitting nanoparticles are capable of absorbing light with any one wavelength in a range of 420 to 490 nm and emitting light with any one wavelength in a range of 490 to 580 nm or 580 to 780 nm.

5. The film of claim 1, wherein the light-emitting layer are quantum dots.

6. The film of claim 1, wherein the emulsion region is in a particle type.

7. The film of claim 6, wherein the particle type has an average diameter in a range of 1 to 200 μm.

8. The film of claim 1, wherein the light-emitting layer includes 5 to 40 parts by weight of the emulsion region with respect to 100 parts by weight of the matrix.

9. The film of claim 1, wherein any one of the matrix and the emulsion region includes a polymer component having a solubility parameter of less than 10 $(cal/cm^3)^{1/2}$, and the other includes a polymer component having a solubility parameter of 10 $(cal/cm^3)^{1/2}$ or more.

10. The film of claim 1, wherein the matrix includes a polymerization unit of a compound of Formula 1, a compound of Formula 2, a compound of Formula 3, a compound of Formula 4, a nitrogen-containing radical polymerizable compound, or a radical polymerizable compound including an acrylic acid, a methacrylic acid or a salt thereof:

[Formula 1]

In Formula 1, Q is hydrogen or an alkyl group, U is an alkylene group, Z is hydrogen, an alkoxy group, an epoxy group or a monovalent hydrocarbon group, and m is an arbitrary number:

[Formula 2]

In Formula 2, Q is hydrogen or an alkyl group, U is an alkylene group, and m is an arbitrary number:

[Formula 3]

In Formula 3, Q is hydrogen or an alkyl group, A is an alkylene group which may be substituted with a hydroxyl group, and U is an alkylene group:

[Formula 4]

In Formula 4, Q is hydrogen or an alkyl group, A and U are each independently an alkylene group, and X is a hydroxyl group or a cyano group.

11. The film of claim 1, wherein the emulsion region includes a polymerization unit of a compound represented by any one of Formulas 5 to 7:

[Formula 5]

In Formula 5, Q is hydrogen or an alkyl group, and B is a linear or branched alkyl group or alicyclic hydrocarbon group, which has 5 or more carbon atoms:

[Formula 6]

In Formula 6, Q is hydrogen or an alkyl group, and U is an alkylene, alkenylene, alkynylene or arylene group:

[Formula 7]

In Formula 7, Q is hydrogen or an alkyl group, U is an alkylene group, Y is a carbon atom, an oxygen atom or a sulfur atom, X is an oxygen atom, a sulfur atom or an alkylene group, Ar is an aryl group, and n is an arbitrary number.

12. The film of claim 1, wherein the light-emitting layer further includes an antioxidant.

13. The film of claim 12, wherein the antioxidant includes oxidizable metal particles.

14. The film of claim 12, wherein the antioxidant is a phenol-based antioxidant, a thioether-based antioxidant, a phosphate-based antioxidant or an amine-based antioxidant.

15. A method of manufacturing the light-emitting layer of claim 1, comprising:
   polymerizing a layer including a mixture of a polymerizable compound capable of forming a polymer having a solubility parameter of 10 $(cal/cm^3)^{1/2}$ or more and a polymerizable compound capable of forming a polymer having a solubility parameter of less than 10 $(cal/cm^3)^{1/2}$.

16. A lighting device, comprising:
   a light source; and
   the light-emitting film of claim 1,
   wherein the light source and the light-emitting film are disposed such that light emitted from the light source is incident into the light-emitting film.

17. The device of claim 16, wherein the light source emits light with any one wavelength in a range of 420 to 490 nm.

18. A display device comprising the lighting device of claim 16.

* * * * *